United States Patent [19]

Chartier

[11] Patent Number: 4,938,567

[45] Date of Patent: Jul. 3, 1990

[54] ELECTRO-OPTICAL DISPLAY PANEL WITH CONTROL TRANSISTORS AND METHOD FOR MAKING IT

[75] Inventor: Eric Chartier, Chatenay Malabry, France

[73] Assignee: Thomson Grand Public, Paris, France

[21] Appl. No.: 218,126

[22] PCT Filed: Oct. 16, 1987

[86] PCT No.: PCT/FR87/00403

§ 371 Date: Jul. 20, 1988

§ 102(e) Date: Jul. 20, 1988

[87] PCT Pub. No.: WO88/02872

PCT Pub. Date: Apr. 21, 1988

[30] Foreign Application Priority Data

Oct. 17, 1986 [FR] France ................... 86 14410

[51] Int. Cl.$^5$ .......................... G02F 1/01; G02F 1/133
[52] U.S. Cl. ........................ 350/333; 350/355
[58] Field of Search ............ 350/333, 355, 356

[56] References Cited

U.S. PATENT DOCUMENTS

| | | | |
|---|---|---|---|
| 4,470,060 | 9/1984 | Yamazaki | 350/333 X |
| 4,818,077 | 4/1989 | Ohwada et al. | 350/333 X |
| 4,820,024 | 4/1989 | Nishiura | 350/333 |

FOREIGN PATENT DOCUMENTS

| | | |
|---|---|---|
| 0103523 | 3/1984 | European Pat. Off. . |
| 3502911 | 1/1985 | Fed. Rep. of Germany . |
| 61-3118 | 1/1986 | Japan . |

*Primary Examiner*—Eugene R. Laroche
*Assistant Examiner*—Nathan W. McCutcheon
*Attorney, Agent, or Firm*—Roland Plottel

[57] ABSTRACT

The invention concerns an electro-optical panel and, more especially, an intersection point transistor structure made with thin films, wherein there is provided a doubling of the line and column electrodes (LG, CL) by doubling elements (1g$_1$, Col. 1, Col. 2), as well as a light barrier (EC) shielding a transistor. The invention also concerns a method for making a screen of this type. The invention can be applied especially in the technology of liquid crystal display panels.

24 Claims, 6 Drawing Sheets

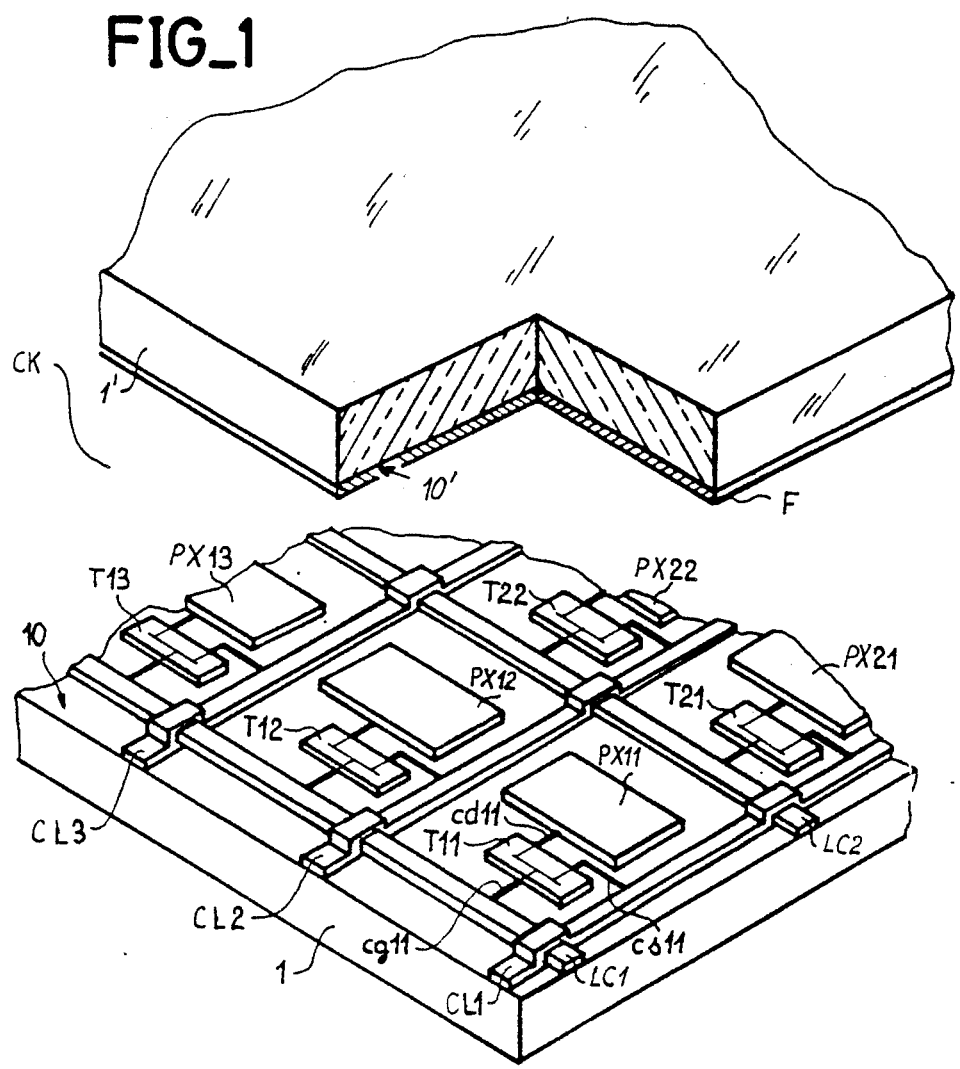
FIG_1

FIG_2
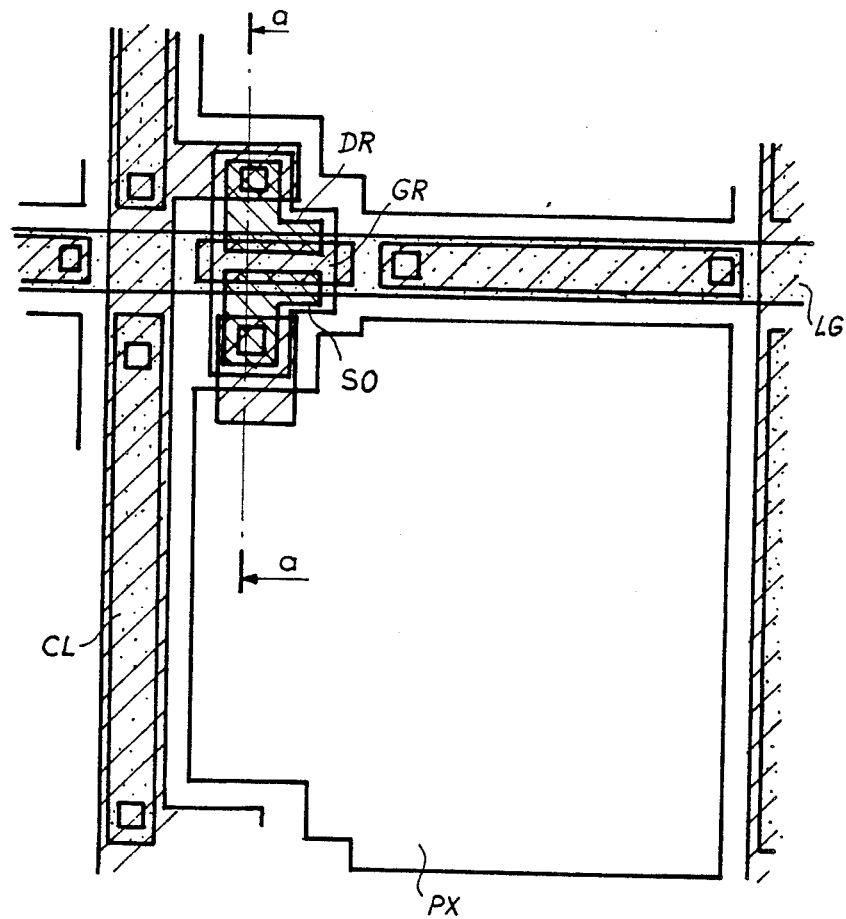

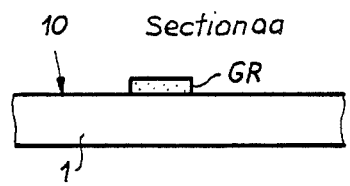
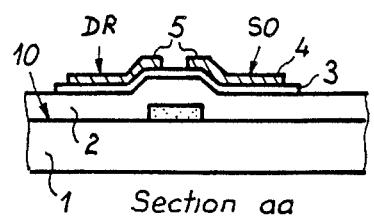
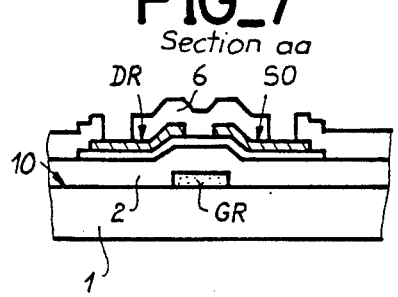
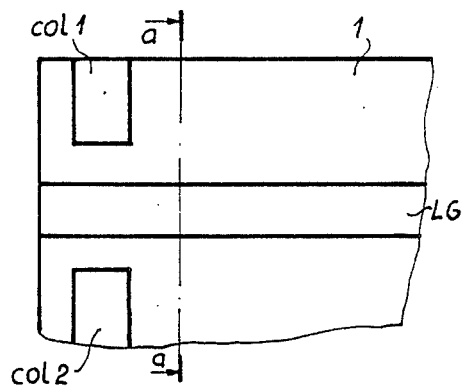
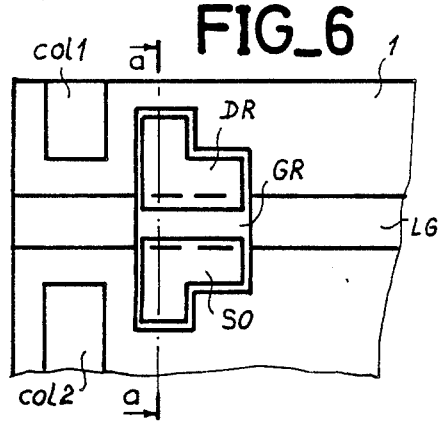
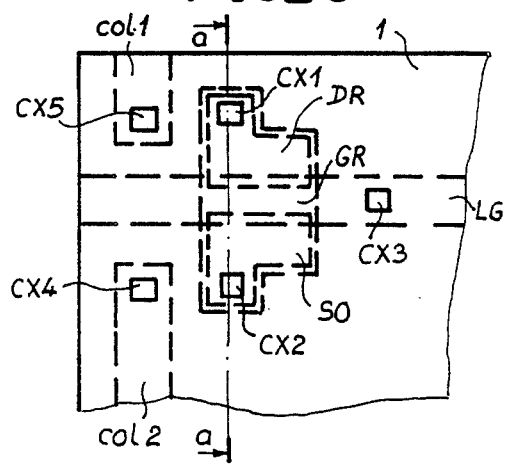

FIG_9
Section aa
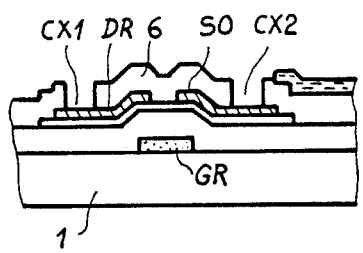
FIG_10
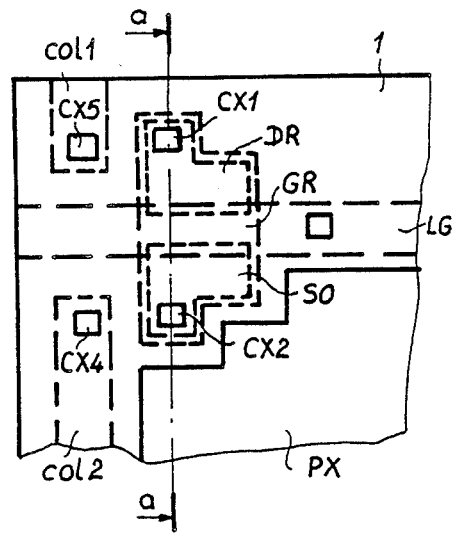
FIG_11
Section aa
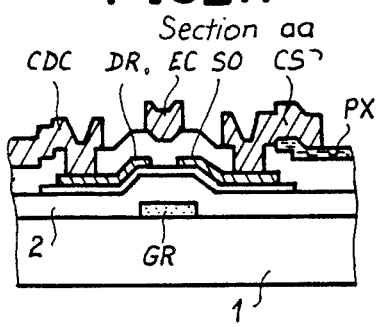
FIG_12
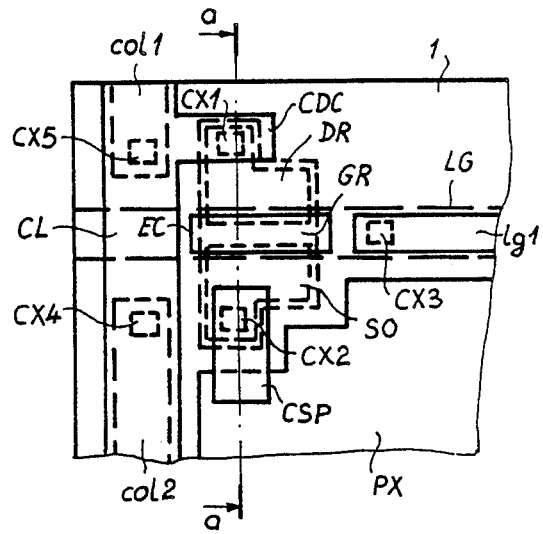

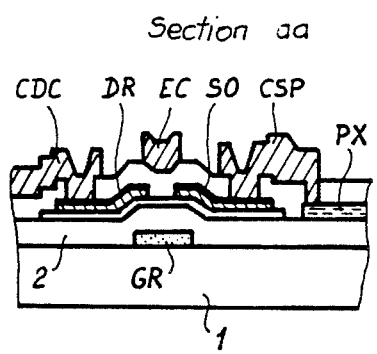
FIG_13
Section aa
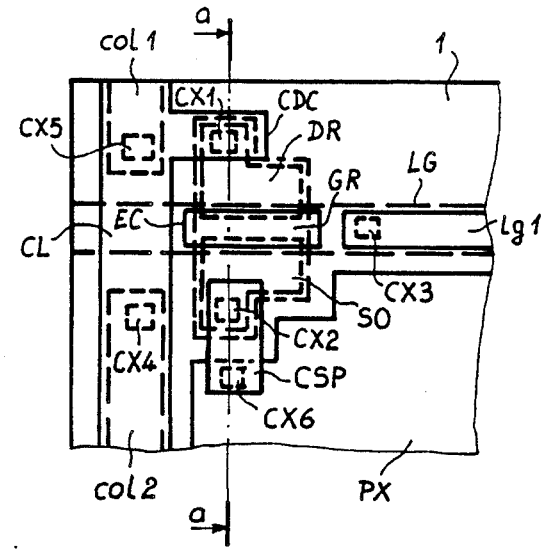
FIG_14
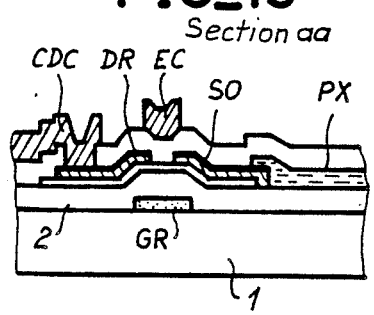
FIG_15
Section aa
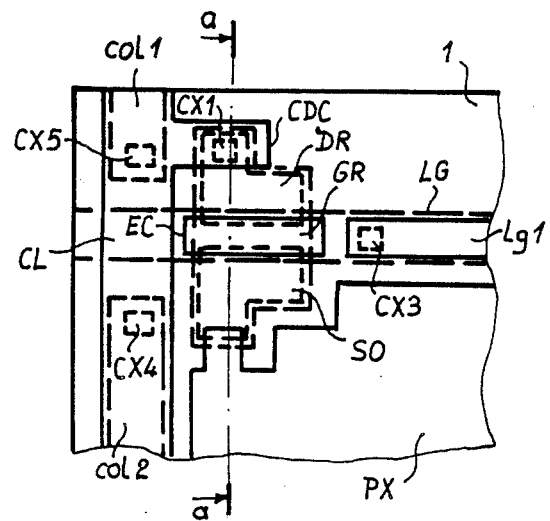
FIG_16

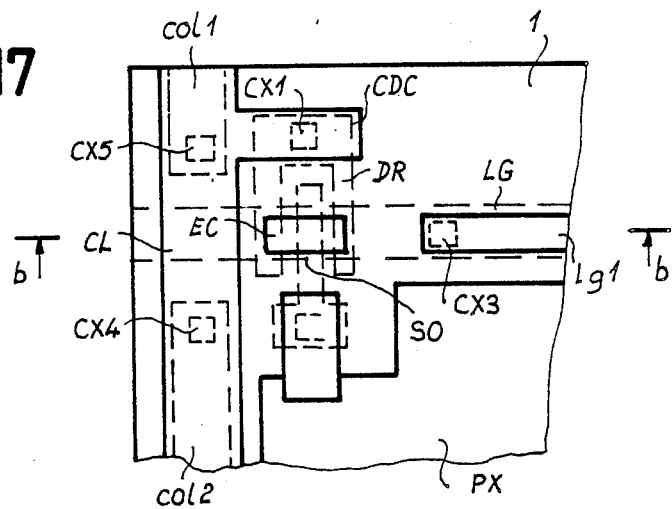
FIG_17
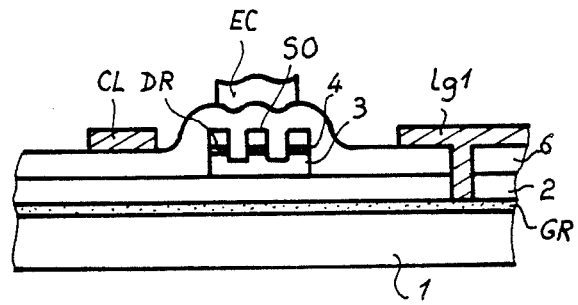
FIG_18
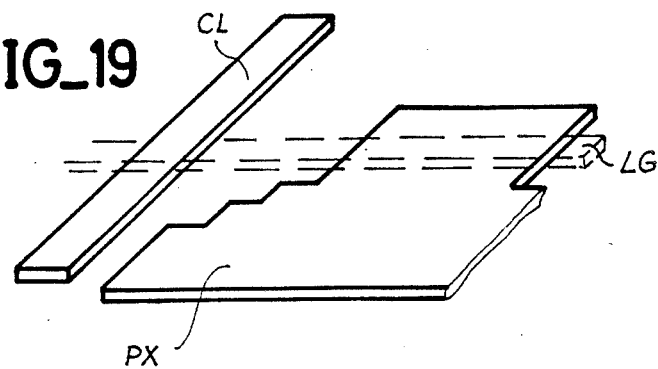
FIG_19

ELECTRO-OPTICAL DISPLAY PANEL WITH CONTROL TRANSISTORS AND METHOD FOR MAKING IT

The invention concerns an electro-optical display panel with control transistors and, more particularly, a flat panel in which each pixel to be displayed is controlled by a transistor. It can be applied to the making of large-area liquid crystal flat panels, the control transistors of which are made by integration in the form of thin layers. The method according to the invention enables the making of a panel by a redundant method with a minimum number of lithographic masks.

As is known, these panels generally have a large number of elementary points or pixels which are square-shaped or rectangular. These pixels should be addressed individually. The definition of the panel depends on the number of point capable of receiving a piece of information. Each point is controlled by applying an electrical field through the liquid crystal. To display alphanumerical or graphic data, matrix-type displays have been proposed. Each pixel is then defined by the intersection of two networks of orthogonal conductors called lines and columns.

The addressing of these matrix display panels is becoming increasingly important as it being sought to increase their definition, namely the number of pixels.

Since the pixels are addressed sequentially line by line, the number of lines that can be addressed is generally limited by the characteristics of the electro-optical effect of the liquid crystal used. The difference in voltages that can be achieved in direct addressing between an lit-up state and an off state, by placing the line and column voltages in phase or in phase opposition, diminishes with the number of lines. The possibility of addressing a large number of lines (<100) then arises to the detriment of the other characteristics of the panel (diminishing of contrast and an ever increasing variation in contrast with the visual angle). To improve the performance of these panels, a transistor or a non-linear element can be series connected with each pixel (forming a capacitor). The set then behaves like a memory element. A voltage is charged when the transistor is unblocked by a line pulse. This voltage is maintained in the pixel for the rest of the time of the frame during which the transistor is off.

At present, the requirements of display panel technology relate to a higher definition of the image. In matrix display type panels, this then leads to designing devices with a large number of addressing lines or columns. Their number can go up to 1024 or even more. This correspondingly increases the number of control transistors. For series manufacturing, it is necessary especially to obtain high output, good reproducibility and high stability for these components. It is further necessary to adapt, also with good reproducibility, the electrical characteristics of the component to that of the associated cell.

A presently common method of resolving this problem and of improving the performance of these panels consists in doing this addressing operation by means of a matrix of transistors in thin films: this amounts to directly coupling the electro-optical effect to a giant, but low-resolution "integrated circuit" responsible for performing the data shunting and memorizing functions.

This approach definitely entails technological difficulties both in the making of thin film transistors and as regards the interconnection conductors. In particular, it is imperative that, among the very large number of intersections between the lines and columns of the interconnection system, no intersection should be defective.

For, according to a usual technique, the transistors are located at the points of intersection of line conductors and column conductors which are insulated from each other in such a way that an appropriate potential difference, applied between a line and a column, determines whether the transistor connected between this line, this column and the adjacent pixel is on or off.

The present invention relates to display panels comprising a layer of electro-optical material controlled by an integrated matrix of transistors. This invention describes the manufacturing method of a panel of this type. The current technologies use 2 or 3 levels of masking with transistors gate side up, and 4 to 5 levels of maskings for transistors gate side down. But technologies of this type suffer from a lack of flexibility when it is sought to improve the image by a storage capacity or a light barrier.

The following method can be used to build a very sophisticated panel (light barrier and storage capacity) in six levels of masking, but combine the technological advantages achieved with seven or nine levels of maskings. These advantages are redundancy in lines and columns which are doubled to avoid breaks, double insulation at the intersection of the lines and columns with a silicon pad, if necessary, as a reinforcement. There is no additional etching which is not essential to release the outward connections of the lines and columns. The connections of the lines and columns can be of the same nature. The pixel can be insulated with ITO (indium tin oxide) between the two layers of insulants, thus reducing the number of false points through short circuits with the line or the column. Or else a storage capacity can be made between the previous line and the pixel with a double layer of insulants to prevent short circuits. Finally, this technology uses transistors, gate side down, where the aging of the transistors is improved both at the level of the channel and at that of the contacts.

The invention therefore relates to an electro-optical display panel with control transistors comprising:
  a first strip and a second strip which are parallel and which enclose an electro-optical material;
  the first strip being provided on its surface, in contact with the electro-optical material, with a matrix of pixels arranged in lines and columns, line control electrodes at a rate of one electrode associated with each line of pixels of said matrix and placed parallel to each line of pixels, and control transistors at a rate of one transistor per pixel coupling this pixel to said line control electrodes;
  the second strip being provided, on its surface in contact with the electro-optical material, with at least one electrode; characterized in that each transistor comprises:
  a gate placed on the surface of the first strip and associated with a line control electrode;
  a first layer of insulating material covering the entire said face with the line control electrodes and gates;
  an element made of amorphous semi-conductive material overlapping the gate;

a source placed on this element made of amorphous semi-conductive material and extending from one edge of the gate towards a pixel;

a drain placed on said element made of amorphous semi-conductor material and extending from another edge of the gate towards a column electrode;

a second layer of insulating material covering the entire panel on which the following elements are placed:

at least one pixel;

a first connection element crossing the second layer of insulant and connecting the source to the pixel;

at least one column control electrode;

a second connecting element crossing the second layer of insulant and connecting the drain to said column;

a light barrier placed above the gate.

The invention also concerns a method for making a liquid crystal display panel, characterized in that it comprises the following steps:

(a) a first step for making, on the surface of said first strip of line control electrodes, gates connected to these line control electrodes and portions of column electrodes that do not cut the line electrodes.

(b) a second step for the sucessive making of a first layer of insulant, a layer of an amorphous semi-conducting material, a layer of a doped semi-conducting material and, if necessary, a metallic layer;

(c) a third step of making two etchings, in the layer of amorphous semi-conductive material, of elements that each overlap a gate and, in the layer of doped semi-conductive material and in the metallic layer, of a source and a drain leaving an unoccupied space above the gate and extending, as for the source, towards the location of a pixel and, as for the drain, towards the location of a column electrode;

(d) a fourth step for the making of a second passivation insulant layer;

(e) a fifth step for the etching of cavities for the connection of contacts crossing the second layer of insulant at the location of the sources and drains, and cavities for the connection of contacts crossing the first layer and second layer of insulant at the location of the line and column electrodes;

(f) a sixth step for the depositing of a layer of a conductive material;

(g) a seventh step for the etching of pixels in this conductive layer;

(h) an eighth layer for the depositing of a metallic layer;

(i) a ninth step for the etching in this metallic layer:

of column control electrodes passing through the cavities for the connection of contacts, thus enabling them to be connected to column electrodes;

portions of line electrodes passing through the cavities for the connection of contacts (CX3) enabling them to be connected to line control electrodes (LG);

connection elements connecting, firstly, a source to a column electrode and, secondly, a drain to a pixel;

light barriers shielding the amorphous semi-conducting material on top of the gate from all incident light;

(j) a tenth step for finishing a panel comprising the following operations:

the depositing of a fixing layer;

the positioning of thickness shims;

the making of the counter-strip with a transparent counter-electrode covered with a fixing strip;

the placing of a liquid crystal.

The various objects and features of the invention will appear more clearly from the following description which is made with reference to the appended figures, representing:

FIG. 1, a perspective view of an embodiment of a liquid crystal display panel according to the prior art;

FIG. 2, a general view of an embodiment of a liquid crystal display panel according to the invention;

FIGS. 3 to 12, different steps in the method for making the liquid crystal display panel according to the invention;

FIGS. 13 to 14, an alternative embodiment of the liquid crystal display panel according to the invention;

FIGS. 15 and 16, another alternative embodiment of the liquid crystal display according to the invention;

FIGS. 17 to 19, other alternative embodiments of the liquid crystal display panel according to the invention.

Referring to FIG. 1 we shall first decribe an example of a known liquid crystal display panel such as the one described, for example, in the French patent application Nos. 85.12804 or 85.16935.

This figure shows, on a surface 10 of a first strip 1, the line conductors LG1 and LG2, the column conductors CL1, CL2 and CL3. Connected substantially to each intersection point, there are also transistors and pixels such as the transistor T11 and the pixel PX11 located at the intersection of the line conductor LG1 and the column conductor CL1.

The second strip 1', preferably made of glass, provided with at least one eletrode F, determines with one of its sides 10' and the side 10 of the strip 1, a space in which a liquid crystal CX is placed.

The strip 1' is transparent. A pixel of the surface 10 such as PX11, the strip 1' which faces it and the liquid crystal which separate them constitute a liquid crystal cell of the panel.

The working of a panel of this type is known. It may be simply recalled that to display a piece of information on a liquid crystal cell, suitable potentials should be applied to a line (LG1 for example) and a column (CL1 for example) turning on the transistor T11 which then applies a potential to the pixel PX11 in such a way that the pixel PX11 of the cell CL11 is subjected to a difference in potential enabling a change in the state of the liquid crystal.

Referring to FIGS. 2, 11 and 12 we shall describe an embodiment of a display panel according to the invention.

FIG. 2 shows a general view of a part of a liquid crystal display panel. FIG. 12 gives a more detailed view of an intersection point of the panel and FIG. 11 shows a sectional view along as of FIG. 12, where the structure of a transistor of a point of intersection is seen more clearly. We shall therefore refer more especially, in the following description, to FIGS. 11 and 12 to describe a control transistor of the panel, but for clearer understanding, reference can also be made to FIG. 2 where the same references designate the same elements.

On the surface 10 of a substrate, there are placed line control electrodes such as LG, gates such GR and portions of column electrodes Col1, Col2. According to the embodiment shown in the figures, a gate GR consists of a line electrode portion.

The gates GR and line electrodes are covered with a layer of insulating material such as $Si_3N_4$. On this layer, on top of each grill, there is an element made of a non-doped semi-conducting material such as amorphous silicon.

To complete the control transistor, a source SO and a drain DR are located on the element 3 on either side of the gate. This source and this conductor are made of doped semi-conductive material such as n+ doped silicon coated with a metallic layer. The entire unit is covered with a passivation insulant layer 6 such as $Si_3N_4$ or $SiO_2$.

On this insulating layer 6 there are made pixels PX as well as light barriers EC, column control electrodes and portions of line electrodes such as lg 1.

The light barriers EC each cover a surface greater than a drain/source space so as to shield the non-doped semi-conductor from light.

Finally, connection elements complete the structure. It is thus that:

connection elements such as CSP cross the passivation insulant layer 6 and each connect a source SO to a pixel PX;

connection elements such as CDC cross the passivation insulant layer 6 and each connect a drain DR to a column control electrode;

connection elements such as CX3, CX4, CX5 cross both insulant layers 2 and 6 and connect, firstly, the line electrode portions (lg 1) to the line control electrodes LG (this is the case for the element CX3) and, secondly, the column electrodes CL to the column electrode portions Col 1, Col 2 (as is the case for the elements CX4, CX5).

According to an alternative embodiment of the panel of the invention, as shown in FIGS. 13 and 14, the pixels PX are shown located between the two layers 2 and 6 of insulating material. The insulant layer then serves as a storage capacity for the panel. Furthermore, this enables a reduction in the number of false points because the line electrodes and the column electrodes are no longer at the same level as the pixels.

In this case each connecting element CSP, connecting source SO to a pixel PX, crosses the insulant layer 6.

According to another embodiment shown in FIGS. 15 and 16 and derived from that of FIGS. 13 and 14, each pixel PX is directly connected to a source SO.

According to another alternative embodiment, connecting elements which are not shown connect the light barrier to the gate located at the bottom. Thus a double-gate transistor is got.

Another alternative embodiment according to the invention comprises, as shown in FIGS. 17 and 18, at least one indentation for the source SO in such a way that this source is placed crosswise with respect to the gate GR, and at least another indentation for the drain DR, directed parallel to the source in such a way that the drain is also crosswise with respect to the gate. An embodiment of this type gives the transistor which is geometrically constant for all variations in the positioning of the masks. A double indentation of the drain provides a gain in space and does away with the effect of variations in the width of the lines on the unwanted capacitances of the TFT.

In the embodiment shown in FIGS. 17 and 18, the drain DR has two indentations surrounding the source SO.

On top of the gate, overlapping the drain and the source, the light barrier shields the transistor from light. It must be noted that the transistor is entirely protected by the gate GR from the light coming through the substrate 1.

Finally, according to another alternative shown in a simplified way in FIG. 19, the pixel PS has at least one indentation which extends above the line electrode so as to constitute a storage capacity with the insulant material located between this indentation and the line electrode. This storage capacity improves the holding time of the display and improves the grey shades. Moreover, in giving this indentation of the pixel a maximum width, this indentation may constitute an armour for the liquid crystal against the effects of the voltage of the line electrode.

We shall now describe an example of a manufacturing method according to the invention. FIGS. 3 to 12 illustrate different steps in this method.

During a first step, on the surface 10 of a substrate 1, such as a glass strip, electrodes are made with a conductive material for the control of the lines LG, gates GR connected to these electrodes and portions of column electrodes Col 1, Col 2 called column reinforcements. Thus a configuration is obtained as shown in FIGS. 3 and 4 wherein, for example, a gate GR is actually a part of a line controlled electrode LG. This manufacturing step is performed by depositing a thin metallic layer on a virgin substrate under the best possible temperature and cleaning conditions to obtain a metal with low resistivity and without holes and then, by photolithography, by attack on the lines, transistor gates and column reinforcements. This metal, which is chemically resistant like chromium, can be cleaned violently with acids.

During a second step, a layer 3 of an amorphous semi-conductor material, a layer of an n+ doped semi-conductive material, and if necessary, a layer 5 of a metallic material are made successively. For example, in the same machine, a gate insulant, for example $Si_3N_4$, a semi-conductor, for example non-doped amorphous silicon, a layer for ohmic contact, for example a layer of n+ doped amorphous silicon, are deposited successively in the same machine. All these layers will be made, for example, by a plasma assisted heat decomposition method or else by sputtering. If necessary, a metal is deposited such as chrome in a very thin layer. This metal is subsequently used to improve selectivity when attacking the gate and passivation insulants or else to shield the amorphous silicon beneath this layer.

During a third step, the metal and the n+ doped silicon are etched with source SO and drain DR contact blocks in a second photolithography operation. A step of this kind is easy to adjust because the silicon is attacked on a very wide surface, thus enabling very precise detections at the end of the attack by dry method, the signal that is sent back being very big. The layer of non-doped semi-conductor can then be very thin and it is known that it then becomes far less photoconductive.

The non-doped silicon is etched in a third photolithography operation that can be made very precise with respect to the insulant because a very thin, very uniform, non-doped and very extensive layer is etched. Thus a component such as the one shown in FIGS. 5 and 6 is got.

During a fourth step, an inorganic passivation insulant 6 such as $Si_3N_3$ or $SiO_2$ is deposited on the previous structure which is easy to clean with acid baths, with very small steps to be crossed for the passivation insulant.

During a fifth step, this passivation insulant 6 and, at times, the gate insulant 2 are etched in a fourth photolithographic operation. This thus enables the subsequent making of the necessary contacts at the output of the sources and drains of the transistors, needed at the outputs at the end of the lines and columns, by the metal of the lines and columns and, as the case may be, for connecting the light barrier to the gate.

In a sixth step, a conducting and possibly transparent layer, made of doped indium tin oxide (called ITO) is deposited. This deposit is etched in a seventh step with pixels PX, contact blocks, doubled lines and columns or storage capacity with double insulant.

In an eighth step, a metal is deposited. This metal is etched in a ninth step with columns, contacts on source and drain, source and pixel contacts, doubling of lines and light barrier.

According to an alternative method of manufacture, there can be provision, at this stage, for connecting the light barrier EC to the gate GR to make a double gate transistor.

According to this embodiment, the faults due to short circuits can be corrected. Since the intersection of lines and columns has double insulation, and this is a definite advantage, most of the short circuits will be localized on the transistor. It is therefore enough to cut the incomings at these transistors to insulate these major faults without having to cut the line or the column (electronic costs). If necessary, the ends of the cut lines and columns will be connected to both ends. It will be noted that the light barrier on an insulant deposited on a small step is far better insulated than in the standard method using self-aligned drains and columns.

The liquid crystal and the metallic lines and columns can be insulated without any disadvantage by an organic polymer deposit which can be removed by organic solvents, on the external contacts, once the cell is sealed.

A tenth step for finishing the panel may be considered to be a standard one. It consists in the making of the counter-strip, colored filters if necessary, fixing layers on both strips (friction-treated polyimide, evaporation of SiO etc.), the sealing of the two strips filling with liquid crystal, removal of passivation polymers and of fixing polymers, if any, on the contacts.

According to an alternative manufacturing method according to the invention, there is provision for making the PX pixels between the two insulant layers 2 and 6. For this purpose, according to this alternative method, the above-described sixth and seventh steps are made before the fourth step for depositing passivation insulant 6. Thus a structure is obtained such as the one described in FIGS. 13 or 14.

According to another alternative method derived from the above one and shown in FIGS. 15 and 16, the sixth and seventh steps being performed before the fourth step, there is provision, in the seventh step for etching pixels PX, for also etching the connection elements KC which directly connect a source SO to a pixel PX. Furthermore, according to this alternative, there is provision, in the second and third steps, for making, firstly, the amorphous semi-conducting material element 3, and then for making the layer of doped semeconducting material 4 and the metallic layer 5 and then for etching these two last layers.

In these conditions, the amorphous semi-conducting material 3 is not in contact with the pixel PX.

Finally, according to another alternative method, the sixth and seventh steps can be performed after the ninth step.

The invention can thus be used to obtain a panel and in which each intersection point has double insulation and in which each pixel has high storage capacity.

It is clear that the above description has been given only as an example and that other alternatives can be considered without going beyond the scope of the invention.

I claim:

1. An electro-optical display panel with control transistors comprising:
   a first strip and a second strip (1, 1') which are parallel and which enclose an electro-optical material (CX);
   the first strip (1) being provided on its surface (10), in contact with the electro-optical material (CX), with a matrix of pixels (PX11 to PX22) arranged in lines and columns, line control electrodes (LG1, LG2) at a rate of one electrode associated with each line of pixels of said matrix and placed parallel to each line pixels, and control transistors (T11 to T22) at a rate of one transistor per pixel (PX11 to PX22) coupling the pixel to said line control electrodes;
   the second strip (1') being provided, on its surface (10') in contact with the electro-optical material (CX), with at least one electrode (F); characterized in that each transistor comprised:
   a gate (GR) placed on the surface (10) and associated with a line control electrode (LG);
   a first layer (2) of insulating material covering the entire surface (10) with the line control electrodes (LG) and the gates (GR);
   an element (3) made of amorphous semi-conductive material overlapping the gate (GR);
   a source (SO) placed on this element (3) made of amorphous semi-conductive material and extending from one edge of the gate towards a pixel;
   a drain (DR) placed on said element (3) made of amorphous semi-conductor material and extending from another edge of the gate towards a column electrode;
   a second layer of insulant material (6) covering the entire panel on which the following elements are placed:
   at least one pixel (PX);
   a first connection element (CSP) crossing the second insulant layer (6) and connecting the source (SO) to the pixel (PX);
   at least one column control electrode (CL);
   a second connecting element (CDC) crossing the second insulant layer (6) and connecting the drain (DR) to said column control electrode;
   a light barrier (EC) placed above the gate.

2. A panel according to claim 1 characterized in that the light barrier (EC) is made of a metallic material.

3. A panel according to claim 1 characterized in that it comprises, on the surface (10) of the first strip (1), duplicated portions of column electrodes (Col 1, Col 2) interrupted in the vicinity of each control transistor and connected by connection elements (CX4, CX5), crossing the first and second insulant layers (2 and 6), to a column control electrode (CL).

4. A panel according to claim 1 characterized in that it comprises, on the second layer of insulant material (6) duplicated portions of line electrodes (LG1) interrupted in the vicinity of each transistor and connected by connection elements (CX3), crossing the first and second insulant layers (2 and 6) to a line electrode (LG).

5. A panel according to claim 1 characterized in that each pixel (PX) is located between the first and second layers of insulant material (2, 6).

6. A panel according to claim 5 characterized in that it comprises connection elements (CSP) crossing the second insulant layer (6) and connecting the source (SO) with a pixel (PX).

7. A panel according to claim 5 characterized in that each pixel has a connection directly connecting the pixel (PX) to a source (SO).

8. A panel according to claim 1 characterized in that each element (3) made of amorphous semi-conducting material is slightly compensated in boron to reduce its photoconductivity.

9. A panel according to claim 1 characterized in that:
the element (3) made of amorphous semi-conducting material covers a part of the gate (GR) so as to be completely shielded from the light that reaches the substrate;
the source (SO) comprises at least one indentation crosswise with respect to the gate (GR) and the element (3) made of semi-conducting material;
the drain (DR) also has at least one indentation parallel to the indentation of the source (SO);
the light barrier (EC) is placed above the gate and the element (3) made of semi-conductive material (3), thus overlapping the source and drain indentations.

10. A panel according to claim 2 characterized in that the drain (DR) comprises at least two indentations framing an indentation of the source (SO).

11. A panel according to claim 1 characterized in that the pixel (PX) comprises an indentation which extends over the line electrode that controls it.

12. A method for making a liquid crystal display panel according to claim 1 characterized in that it comprises the following steps:
a first step for making on a surface (10) of first strip (1) of line control electrodes (LG), gates (GR) connected to these line control electrodes (LG) and portions of column electrodes (Col 1, Col 2) that do not cut the line electrodes (LG).

(b) a second step for the successive making of a first insulant layer (2), a layer of an amorphous semi-conducting material (3), a layer of a doped semi-conducting material (4);

(c) a third step of making two etchings, in the layer of amorphous semi-conductive material (3), of elements that each overlap a gate (GR) and, in the layer of doped semi-conducting material, of a source (SO) and a drain (DR) leaving an unoccupied space above the gate and extending, as for the source (SO), towards the location of a pixel and, as for the drain (DR), towards the location of a column electrode;

(d) a fourth step for the making of a second passivation insulant layer (6);

(e) a fifth step for the etching of cavities (CX1, CX2) for the connection of contacts crossing the second insulant layer (6) at the location of the sources and drains, and of cavities (CX3, CX4, CX5) for the connection of contacts crossing the first layer and second layer of insulant (2, 6) at the location of the line and column electrodes;

(f) a sixth step for the depositing of a layer of a conductive material;

(g) a seventh step for the etching of pixels (PX) in this conductive layer;

(h) an eighth step for the depositing of a metallic layer over the layers on the surface;

(i) a ninth step for the etching in this metallic layer:
of column control electrodes passing through the cavities for the connection of contacts (CX4, CX5), enabling them to be connected to portions of column electrodes (Col 1, Col 2);
portions of line electrodes passing through the cavities for the connection of contacts (CX3) enabling them to be connected to line control electrodes (LG);
connection elements connecting, firstly, a source (SO) to column electrode and, secondly, a drain to a pixel;
light barriers (EC) shielding the amorphous semi-conducting material on top of the gate from an incident light;

(j) a tenth step for finishing a panel comprising the following operations:
the depositing of a fixing layer;
the positioning of thickness shims;
the making of the counter-strip with a transparent counter-electrode covered with a fixing strip;
placing of a liquid crystal.

13. A method according to claim 12 characterized in that the second step is completed by making a layer of metal (5) and in that, during the third step, this layer is also etched to make the source (SO) and drain (DR) contacts.

14. A method according to claim 12 characterized in that the first step comprises a step for depositing a metallic layer on a surface (10) of a substrate 1 followed by a stage for the etching by photolithography of the line control electrodes (LG), gates (GR) and column electrode portions (Col 1, Col 2).

15. A method according to claim 12 characterized in that the insulant is $Si_3N_3$.

16. A method according to claim 12 characterized in that the semi-conducting material is silicon.

17. A method according to claim 12 characterized in that the second step is performed by a plasma-assisted heat decomposition method or by sputtering.

18. A method according to claim 12 characterized in that the second step comprises the making of a metallic layer (5) on the layer of doped semi-conducting material (4).

19. A method according to claim 18 characterized in that the third step comprises:
a first stage for the etching of the metallic layer (5) and the layer of doped semi-conducting material (4);
a second stage for the etching of the layer of amorphous semi-conducting material (3).

20. A method according to claim 12 characterized in that the third, the fifth and the seventh steps are performed by photolithography.

21. A method according to claim 12 characterized in that in the sequence of step the sixth and seventh steps precede the fifth step.

22. A method according to claim 12 characterized in that the sixth and seventh steps precede the fourth step.

23. A method according to claim 22 characterized in that the seventh step provides for the etching of the connection elements (CSP) of the pixels with the sources and in that the ninth step then does not provide for the making of the connection elements of the pixels with the sources.

24. A method according to claim 12 characterized in that the sixth and the seventh steps are performed after the ninth step.

* * * * *